United States Patent [19]

Theriault

[11] 4,397,037

[45] Aug. 2, 1983

[54] DIPLEXER FOR TELEVISION TUNING SYSTEMS

[75] Inventor: Gerald E. Theriault, Hopewell, N.J.

[73] Assignee: RCA Corporation, New York, N.Y.

[21] Appl. No.: 294,131

[22] Filed: Aug. 19, 1981

[51] Int. Cl.³ .................................................. H04B 1/26
[52] U.S. Cl. .................................... 455/188; 333/132;
455/277; 455/293; 455/311; 455/339
[58] Field of Search .............. 455/131, 143, 150, 188,
455/189, 190, 191, 273, 277, 293, 311, 339, 180;
370/37, 45, 69.1, 123; 333/126, 129, 132–135,
167

[56] References Cited

U.S. PATENT DOCUMENTS

| | | | |
|---|---|---|---|
| 2,358,520 | 9/1944 | Landon . | |
| 2,688,119 | 8/1954 | Gere | 333/5 |
| 2,964,623 | 12/1960 | Bell | 250/20 |
| 3,270,137 | 8/1966 | Halsey | 370/69.1 |
| 3,373,361 | 3/1968 | Winegard . | |
| 3,376,508 | 4/1968 | Jones . | |
| 3,469,194 | 9/1969 | Osborn | 325/370 |
| 3,611,198 | 10/1971 | Ma | 333/6 |
| 3,727,140 | 4/1973 | Nieto et al. . | |
| 3,925,737 | 12/1975 | Headley | 333/6 |
| 3,942,122 | 3/1976 | Nakanishi | 325/459 |
| 4,173,742 | 11/1979 | Lehmann | 333/100 |
| 4,214,212 | 7/1980 | Dipietromaria | 455/180 |
| 4,247,953 | 1/1981 | Shinagawa et al. | 455/191 |

FOREIGN PATENT DOCUMENTS 54-148313 11/1979 Japan .
55-26731 2/1980 Japan .

OTHER PUBLICATIONS

Electronics Designers' Handbook–L. J. Giacoletto 1977, pp. 6–13.

Primary Examiner—Marc E. Bookbinder
Attorney, Agent, or Firm—E. M. Whitacre; P. J. Rasmussen; C. A. Berard, Jr.

[57] ABSTRACT

A diplexer comprises a first frequency selective filter coupled between its first input terminal and a circuit point, a second frequency selective filter coupled between the circuit point and its output terminal, and third frequency selective filter coupled between its second input terminal and the circuit point. The first filter selects frequencies higher than a first frequency and the second filter selects frequencies lower than a second frequency which is higher than the first frequency. The third filter selects frequencies lower than a third frequency which is lower than the first frequency. In a television receiver, the first and second filters serve as a bandpass filter for the UHF band, and the third filter passes the VHF and CATV bands.

16 Claims, 1 Drawing Figure

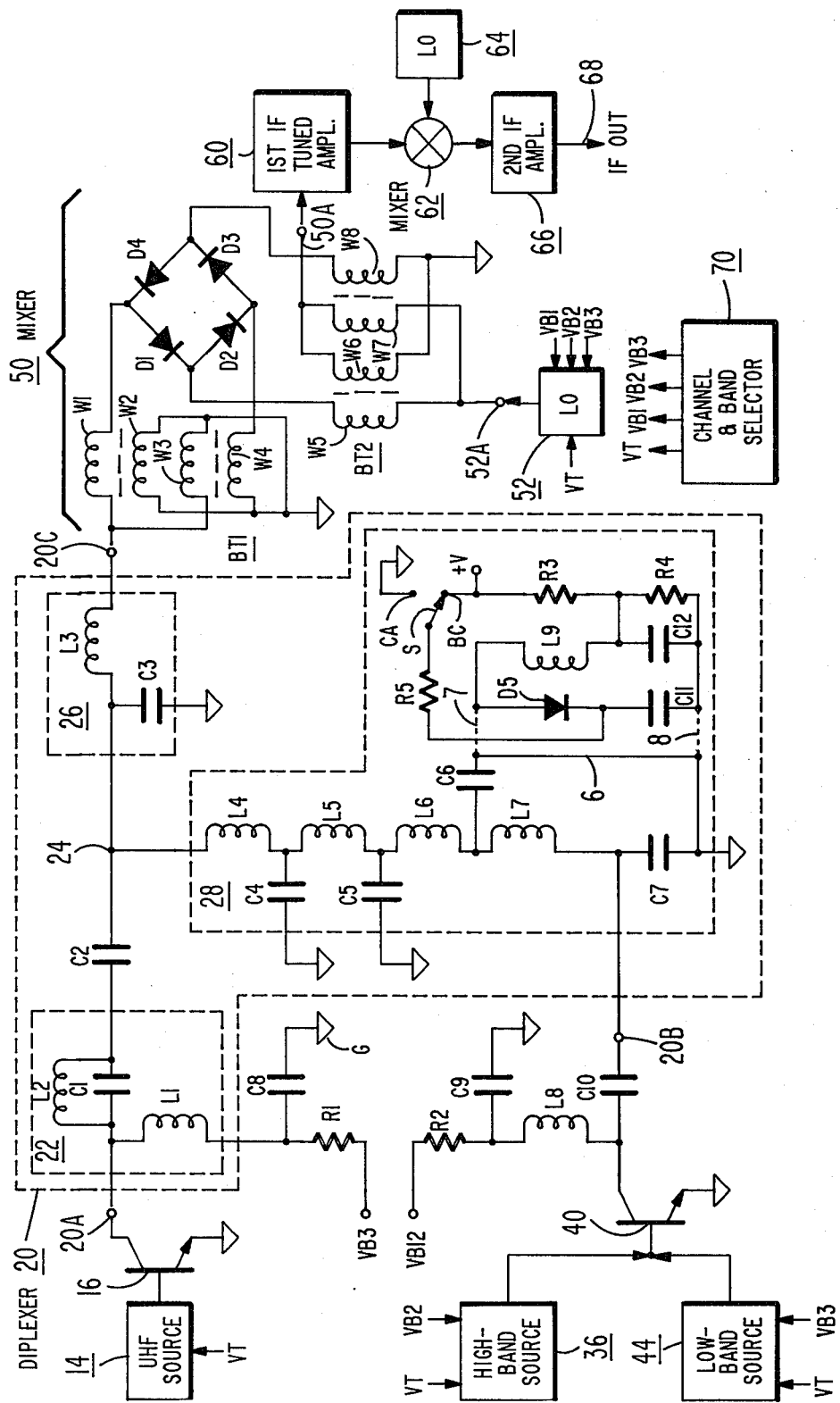

DIPLEXER FOR TELEVISION TUNING SYSTEMS

The present invention relates to apparatus for diplexing electrical signals in a television receiver.

In a television (TV) receiver, signals received from a VHF antenna, a UHF antenna or a cable television (CATV) connection must be combined at some point for processing in a common circuit path. One way to combine those signals is to switch the common path between the various signal sources, for example, such as by diode switches. But diode switches can undesirably degrade the noise figure of a TV tuner, can introduce distortion into the signals, and can undesirably pass high-frequency signals when they are nonconductive and should block such signals.

One way to avoid those difficulties is to employ a diplexer in a double-conversion TV tuning system such as is described in U.S. patent application Ser. No. 294,133 entitled TUNING SYSTEM FOR A TELEVISION RECEIVER filed by G. E. Theriault on even data herewith, which is assigned to the same assignee as is the present invention and is incorporated herein by reference to describe the double-conversion tuning system in detail. A diplexer has first and second input terminals for receiving signals from first and second signal sources and an output terminal at which the two input signals are available. High signal isolation is desirably exhibited between the first and second input terminals and substantial coupling is exhibited between each of the input terminals and the output terminal.

In the present invention, an apparatus for diplexing electrical signals comprises a first frequency selective filter having input and output connections respectively coupled to a first input terminal and to a circuit point, a second frequency selective filter having input and output connections respectively coupled to the circuit point and to an output terminal, and a third frequency selective filter having input and output connections respectively coupled to a second input terminal and the circuit point. The first filter selects frequencies higher than a first frequency and the second filter selects frequencies lower than a second frequency greater than the first frequency. The third filter selects frequencies lower than a third frequency which is less than the first frequency.

In the drawing:

The sole FIGURE is a schematic diagram, partially in block diagram form, of a double-conversion tuning system embodying a circuit of the present invention.

Diplexer 20 receives at its input terminal 20A signals in the UHF television frequency band (470-890 MHz including UHF channels 14-83) from UHF source 14 via common-emitter amplifier transistor 16. UHF source 14 can comprise a UHF antenna and a UHF-band filter tunable in response to a tuning signal VT. High-pass filter 22 selects signals at frequencies greater than about 470 MHz and couples them to circuit point 24. Low-pass filter 26 selects signals at frequencies less than about 890 MHz present at circuit point 24 and couples them to output terminal 20C. High-pass filter 22 and low-pass filter 26 are connected in cascade, and, in effect, the combination serves as a bandpass filter for signals at frequencies in the UHF-TV band.

Diplexer 20 also couples signals received at input terminal 20B from the collector of common-emitter amplifier transistor 40 to its output terminal 20C. Those signals are in the VHF and cable television (CATV) bands as follows.

TABLE 1

| Television Band | Frequency Range (MHz) | TV Channel Numbers |
| --- | --- | --- |
| Low-VHF Band | 54–88 MHz | 2–6 |
| Mid-Band - CATV | 90–174 MHz | A-5 to I |
| High-VHF | 174–216 MHz | 7–13 |
| Super-Band - CATV | 216–402 MHz | J to W + 17 |

Signals in a tuning band between 54 and 150 MHz are supplied to the base of transistor 40 from source 44 which is operative when the selected channel is in that tuning band because channel and band selector 70 develops bandswitch voltage VB3 at that time. Signals in a tuning band between 150 and 401 MHz are supplied from source 36 when band selector 70 develops bandswitch voltage VB2 because the selected channel is in that band. Each of sources 36 and 44 includes a filter tunable in response to tuning signal VT. Low-pass filter 28 of diplexer 20 selects signals at frequencies less than about 402 MHz and couples them from input terminal 20B to circuit point 24. Those signals pass to output terminal 20C through low-pass filter 26 already described.

Mixer 50 receives RF signals from diplexer output 20C and local oscillator signals at terminal 52A to develop RF signals translated to the first intermediate frequency (IF) of about 415 MHz at terminal 50A. Local oscillator 52 develops the local oscillator signal at a frequency determined by bandswitch voltages VB1, VB2 and VB3, and tuning signal VT.

The first IF signal is amplified by tuned amplifier 60 which has a bandwidth somewhat greater than that of the TV channel selected. Mixer 62 develops second IF signals by translating the frequency of the first IF signal to about 46 MHz in response to signals from second local oscillator 64. The second IF signal is amplified by second IF tuned amplifier 66 and is supplied to TV signal processing circuitry from terminal 68.

Channel and band selector 70 develops bandswitch voltages VB1, VB2 and VB3 in response to the channel selected. Selector 70 also develops tuning signal VT in response to the channel selected and the frequency of the IF signal.

The double-conversion tuning system just described in summary fashion is completely described in U.S. patent application Ser. No. 294,133 referred to above.

Diplexer 20 will now be described in specific detail in relation to the FIGURE. This arrangement is beneficial because it provides the desired impedance matching and transformations at its respective input and output terminals, because it provides trapping for the IF frequency, and because it permits signals from separate sources to be combined in a common circuit path without the noise and distortion which could result if diode switching were employed for UHF signals.

In high-pass filter 22 of diplexer 20, capacitor C1 couples signals at relatively higher frequencies between its input at 20A and its output at circuit point 24 while inductor L1 conducts relatively lower frequency signals to ground, indicated by the small triangle, through bypass capacitor C8. C8 is of relatively large value to exhibit a relatively low impedance to signals at UHF frequencies. Capacitor C1 is coupled to circuit point 24 through blocking capacitor C2 which is of large value to exhibit a relatively small impedance to signals at UHF frequencies. C2 blocks the DC potential at the collector of transistor 16 from circuit point 24. That DC operating potential is derived from bandswitch voltage VB3 applied to the collector of transistor 16 through resistor R1 and inductor L1 when a UHF band channel has been selected.

Filter 22 also serves to aid the functioning of the path including filters 26 and 28 as follows. Filter 22 presents a relatively high impedance at circuit point 24 so that signals applied thereto from filter 28 are passed to filter 26 without substantial attenuation. Specifically, C1 and L2 are of value selected to resonate at 250 MHz to minimize loading due to the parasitic collector capacitance of transistor 16. Further L1 and C1 serve as a series resonant trap and are of value selected to resonate at about 415 MHz which is the frequency of the first IF signal developed by mixer 50.

Filter 26 includes series inductance L3 and shunt capacitance C3 forming a single section low-pass filter. In practice, L3 need not be a separate inductor but may be in part the residual inductance of balun transformer BT1 in mixer 50.

Filter 28 is a four-section low-pass filter including inductances L4, L5, L6 and L7 serially connected between its input at 20B and its output at circuit point 24. Shunt capacitances C4, C5, C6 and C7 are connected from interconnection points of the series inductances to ground. Filter 28 aids in the functioning of filters 22 and 26 by presenting a relatively high impedance to UHF TV signals at circuit point 24 so that they are directed to filter 26 without substantial attenuation. Further, L4 and C4 serve as a series resonant trap and have values selected to resonate at the first IF frequency of about 415 MHz.

Operating potential for transistor 40 is supplied from bandswitch voltage VB12 present when the channel selected is in the VHF or CATV frequency bands. That potential is applied to the collector of transistor 40 via resistor R2 and RF choke L8. Capacitor C9 serves as an RF bypass by presenting a relatively low impedance to high frequency signals. Capacitor C10 blocks the DC collector potential at the collector of transistor 40 from filter 28 and provides low impedance to high frequency signals.

Doubly-balanced frequency mixer 50 includes hot carrier diodes D1, D2, D3 and D4 connected in a bridge configuration. Balun transformer BT1 transforms single-ended signals from terminal 20C, at which about 50 ohm impedance is exhibited, to balanced signals applied to the respective anodes of D1 and D3 by windings W1 and W4, at which about 50 ohm impedance is exhibited. Windings W2 and W3 connect the bridge to ground. Balun transformer BT2 transforms single-ended local oscillator signals received at terminal 52A into balanced signals which are applied to the respective anodes of D2 and D4 via windings W5 and W8. Windings W6 and W7 connect the output of balun BT2 to terminal 50A at which the first IF signal is available.

Modifications are contemplated to the present invention which should be limited only by the claims following. For example, alternative forms of filters 22, 26 and 28 can be employed. Filters 22 or 26 could employ additional filter sections if a sharper cutoff were desired. Similarly, filter 28 could employ either a greater or fewer number of filter sections.

A specific modification, desirable when the first IF frequency is about 416 MHz, is shown in the FIGURE. Broadcast TV signals for VHF channel 12 have a picture carrier at about 205 MHz and a sound carrier at about 210 MHz. Because the second harmonics of those carriers, as well as signals at the sum of their frequencies, are close to the IF frequency, it is desirable to provide attenuation at about 410–420 MHz. To that end, C6 serves as a series-resonant trap circuit with inductance L9 when lead 6 is deleted, and leads 7 and 8 (shown in phantom) are inserted.

The C6, L9 trap circuit is selectively connected in circuit when broadcast signals are to be received, and not when CATV signals are to be received, as follows. Operating voltage +V is reduced by the voltage divider including resistances R3 and R4 and is applied to the anode of switch diode D5 through L9. Capacitances C11 and C12 enable direct voltage to be applied across D5 and provide negligible impedance at TV frequencies. For broadcast reception, switch S is in the downward position BC to reverse bias D5 by applying +V to its cathode through resistance R5. With D5 reverse biased, L9 essentially connects lead 7 to lead 8. For CATV reception, switch S is in the upward position CA to forward bias D5 by connecting its cathode to ground via R5. D5 provides a negligible impedance when forward biased so that lead 7 connected to lead 8 through a negligible impedance at TV frequencies to, in effect, short circuit L9.

What is claimed is:

1. Apparatus for diplexing electrical signals comprising:

first and second input terminals, and an output terminal;

fist frequency selective filter means having an input connection to which said first input terminal is coupled and having an output connection coupled to a circuit point, said first filter means for selecting signals at frequencies higher than a first predetermined frequency;

second frequency selective filter means having an input connection coupled to said circuit point and having an output connection coupled to said output terminal, said second filter means for selecting signals at frequencies lower than a second predetermined frequency higher than said first frequency;

third frequency selective filter means having an input connection to which said second input terminal is coupled and having an output connection coupled to said circuit point, said third filter means for selecting signals at frequencies lower than a third predetermined frequency lower than said first frequency, each of said first and third frequency selective filter means providing a respective signal path between its input connection and said circuit point, said respective signal path being without switching means for selecting one of said signal paths to the exclusion of the other of said signal paths;

frequency mixing means having a first connection to which said output terminal is coupled for receiving first signal therefrom, having a second connection for receiving a frequency signal, and having a third connection at which a signal at an intermediate frequency between said first and third frequencies is developed; and means for applying said frequency signal to said second connection to shift the frequency of said first signal to said intermediate frequency.

2. The apparatus of claim 1 further comprising:

a source of signals in a first television band for applying said signals to said first input terminal, said first television band including frequencies between said first and second predetermined frequencies; and a source of further signals in at least a second television band for applying said further signals to said second input terminal, said second television band including frequencies less than said third predetermined frequency.

3. The apparatus of claim 2 or 1 wherein said first filter means comprises a capacitance coupled between its input and output connections and an inductance coupled between its input connection and a reference point.

4. The apparatus of claim 1 wherein said first filter means comprises a capacitance coupled between its input and output connections and an inductance coupled between its input connection and a reference point, said capacitance and said inductance having values selected for resonating at about said intermediate frequency.

5. The apparatus of claim 3 wherein said first filter means further comprises a further inductance connected in parallel with said capacitance.

6. The apparatus of claim 2 or 1 wherein said second filter means comprises an inductance coupled between its input and output connections and a capacitance coupled between its input connection and a reference point.

7. The apparatus of claim 2 or 1 wherein said third filter means comprises a plurality of low-pass frequency selective filter means coupled in cascade between its input and output connections.

8. The apparatus of claim 1 wherein said plurality of low-pass filter means comprises a plurality of inductances serially connected between said input and output connections and a plurality of capacitances each connected between a respective interconnection between said serially connected inductances and a reference point.

9. The apparatus of claim 8 wherein said third filter means includes a further inductance, and means for serially connecting, at least at selected times, said further inductance with one of said plurality of capacitances.

10. The apparatus of claim 1 wherein said third filter means comprises a plurality of inductances serially connected between its respective input and output connections and a plurality of capacitances each connected between a respective interconnection between said serially connected inductances and a reference point, one of said inductances having a first of its ends connected to said circuit point and the one of said capacitances connected to the other end of said one inductance having values selected for resonating at said intermediate frequency.

11. The apparatus of claim 10 wherein said third filter means includes a further inductance, and means for serially connecting, at least at selected times, said further inductance with one of said plurality of capacitances.

12. The apparatus of claim 1 wherein said third frequency selective filter means includes trap circuit means for attenuating signals at frequencies near said intermediate frequency.

13. The apparatus of claim 12 including means for selectively enabling said trap circuit means for a predetermined signal condition.

14. The apparatus of claim 13 wherein said trap circuit means includes an inductance and a capacitance, and said means for selectively enabling said trap circuit means includes a switching diode for coupling said inductance in resonant circuit with said capacitance in response to a control signal.

15. The apparatus of claim 9 wherein said means for serially connecting includes a switching diode for coupling said further inductance in resonant circuit with said one of said plurality of capacitances at said selected times in response to a control signal.

16. The apparatus of claim 11 wherein said means for serially connecting includes a switching diode for coupling said further inductance in resonant circuit with said one of said plurality of capacitances at said selected times in response to a control signal.

* * * * *

UNITED STATES PATENT AND TRADEMARK OFFICE
CERTIFICATE OF CORRECTION

PATENT NO. : 4,397,037
DATED : Aug. 2, 1983
INVENTOR(S) : Gerald E. Theriault

It is certified that error appears in the above-identified patent and that said Letters Patent is hereby corrected as shown below:

Column 2, line 17     "401" should be --402--.
Column 4, line 31     "fist" should be --first--.
Column 4, line 58     "signal" should be --signals--.

Signed and Sealed this

Eighteenth Day of October 1983

[SEAL]

Attest:

GERALD J. MOSSINGHOFF

Attesting Officer     Commissioner of Patents and Trademarks